(12) United States Patent
Nakata et al.

(10) Patent No.: US 6,765,289 B2
(45) Date of Patent: Jul. 20, 2004

(54) REINFORCEMENT MATERIAL FOR SILICON WAFER AND PROCESS FOR PRODUCING IC CHIP USING SAID MATERIAL

(75) Inventors: Yasukazu Nakata, Matsudo (JP); Yuichi Iwakata, Warabi (JP); Takeshi Kondo, Saitama (JP); Hideo Senoo, Kawaguchi (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/840,864

(22) Filed: Apr. 25, 2001

(65) Prior Publication Data

US 2002/0031863 A1 Mar. 14, 2002

(30) Foreign Application Priority Data

Apr. 26, 2000 (JP) ........................................ 2000-126609
Apr. 23, 2001 (JP) ........................................ 2001-124757

(51) Int. Cl.[7] ..................... H01L 23/14; H01L 23/053; H01L 23/06; H01L 21/46; H01L 21/78
(52) U.S. Cl. ..................... 257/702; 257/701; 257/729; 257/782; 257/783; 438/460; 438/464; 438/465
(58) Field of Search ..................... 438/113–4, 118–19, 438/455, 458, 465, 464, 459, 800, 460; 257/777, 782, 783, 679, 684, 702–3, 706–8, 729, 723–4, 798

(56) References Cited

U.S. PATENT DOCUMENTS

| | | | | |
|---|---|---|---|---|
| 4,926,242 A | * | 5/1990 | Itoh et al. ................... | 257/720 |
| 5,338,967 A | * | 8/1994 | Kosaki ........................ | 257/620 |
| 5,457,072 A | * | 10/1995 | Tamaki et al. .............. | 437/226 |
| 5,976,953 A | * | 11/1999 | Zavracky et al. ........... | 438/455 |
| 6,303,471 B1 | * | 10/2001 | Unno et al. ................. | 438/464 |
| 6,479,757 B1 | * | 11/2002 | Tsukagoshi et al. ........ | 174/259 |
| 2002/0031864 A1 | * | 3/2002 | Ball ........................... | 438/113 |

FOREIGN PATENT DOCUMENTS

| | | |
|---|---|---|
| JP | 62-271451 | 11/1987 |
| JP | 10072573 | 3/1998 |
| JP | 10-321563 | 12/1998 |
| JP | 2000-77361 | 3/2000 |
| JP | 2000-148960 | 5/2000 |
| JP | 2000-239622 | 9/2000 |

OTHER PUBLICATIONS

Lide, D. R.; CRC Handbook of Chemistry and Physics; 82 ed.; CRC Press; Washington, D.C.; 2001, pp. 12–233–234.* www.technion.ac.il/technion/material/LibDocs/EngMat-Lab/Book/23.pdf; pp. 176–182.*

* cited by examiner

Primary Examiner—Olik Chaudhuri
Assistant Examiner—Neal Berezny
(74) Attorney, Agent, or Firm—Finnegan, Henderson, Farabow, Garrett & Dunner, LLP

(57) ABSTRACT

Reinforcing material having Rockwell hardness of 60 or above and comprising base material and adhesive is formed, and then the reinforcing material is attached to one side of silicon wafer on which circuits are not formed prior to dicing.

8 Claims, 2 Drawing Sheets

REINFORCEMENT MATERIAL FOR SILICON WAFER AND PROCESS FOR PRODUCING IC CHIP USING SAID MATERIAL

This application is based on Patent Application No. 2000-126609 filed Apr. 26, 2000 and No. 2001-124757 filed Apr. 23, 2001 in Japan, the content of which is incorporated hereinto by reference.

BACKGROUND OF THE INVENTION

1. Field of the Invention

The present invention relates to reinforcing material for a silicon wafer and to a method of manufacture of IC chips using said reinforcing material. In particular, the present invention relates to a reinforcing material provided on a silicon wafer for the purpose of preventing damage of the silicon wafer during dicing and of IC chips employing such wafers after dicing, and to a method of manufacture of IC chips using said reinforcing material.

2. Description of the Related Art

In recent years, in accordance with thinning of IC chip package, thinning of IC chips themselves has been attempted. Especially the thinning of the IC chips for IC cards it is essential to thin as far as possible, since they are not packaged but they connect themselves directly to the circuits of substrates.

Thinning of IC chips is generally accomplished by back-grinding of silicon wafers. Practically they are required to be as thick as 150 to 200 $\mu$m, though the thinner the better, considering that they are mounted on IC cards. IC chips as thick as 200 $\mu$m or below, especially 150 $\mu$m or below are generally easily breakable. Chip breaking particularly tends to occur during dicing of silicon wafers to form IC chips, during picking up of IC chips, during wire bonding, or during mounting on substrate circuits in the face-down process. Therefore, prevention of silicon wafer damaging during dicing and chip breaking are desired as IC chips become thinner.

The Japanese Patent Application Laid-open No. 2000-148960 discloses a technology for a semiconductor apparatus that forms IC cards by simultaneously attaching plurality of pieces of reinforcing metal to plurality of IC chips. In this technology, reinforcing metal pieces are attached after formation of IC chips by dicing silicon wafers on which circuits are formed. Therefore, damage prevention of silicon wafers during dicing is also desired in such a technology.

SUMMARY OF THE INVENTION

It is the purpose of the present invention to provide reinforcing materials for silicon wafers that prevent damage of silicon wafers during dicing, and further prevent damage of IC chips obtained by dicing to make IC chips easier to handle.

In order to solve the above mentioned problem, the reinforcing materials for silicon wafers of the present invention are characterized by being attached to the surfaces of wafers on which circuits are not formed before dicing said silicon wafer on which circuits are formed, said reinforcing material being comprised of base material and an adhesive, and having Rockwell hardness of 60 or above.

Said adhesive is preferably provided on one side of said base material, or impregnated in said base material. Rockwell hardness of said base materials is preferably 60 or above. Further, said adhesive is preferably curable adhesive, the Rockwell hardness of said reinforcing material after said curable adhesive is cured is preferably 60 or above.

The method of manufacture of IC chips of the present invention is characterized by having a step of providing reinforcing material on the surface of a silicon wafer on which circuits are not formed, before dicing of said silicon wafer on which circuits are formed, and a step of simultaneous dicing of said silicon wafer and the reinforcing material provided on said silicon wafer, said reinforcing material being comprised of base material and adhesive and having Rockwell hardness of 60 or above. The method of manufacture of said IC chips preferably has a step of curing of said adhesive forming reinforcing material, before dicing of said silicon wafers.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1A:
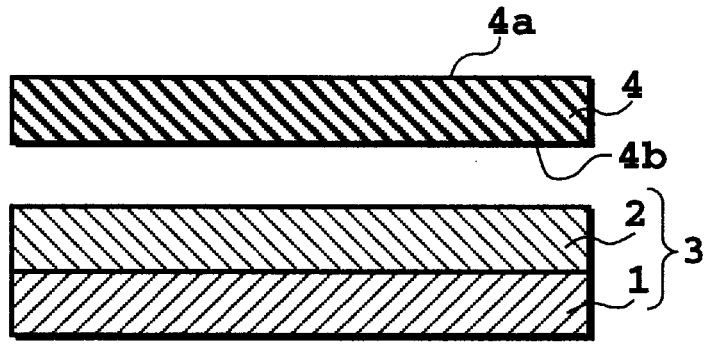
FIGS. 1A through 1C are schematic cross-sectional views illustrating in order the steps of the first method of manufacture of IC chips according to the present invention.

The reinforcing material for silicon wafers according to the present invention and the method of manufacture of IC chips using said reinforcing material are explained below.

Firstly, the reinforcing material for silicon wafers according to the present invention is explained. The reinforcing material for silicon wafers according to the present invention is comprised of base material and adhesive for attaching said base material to silicon wafers. Damage prevention of silicon wafers during dicing can be realized by attaching the reinforcing material to the surface of a silicon wafer on which circuits are not formed (to be called the bottom surface of a silicon wafer hereafter), and dicing the silicon wafer and the reinforcing material simultaneously.

The Rockwell hardness of the reinforcing material should be 60 or above in order to obtain sufficient reinforcing effect using the reinforcing material of the present invention. The term "Rockwell hardness (to be called HRM hereafter)" here in this specification is used as a unit for evaluation of hardness of reinforcing materials, determined according to the method described below.

As the base material comprising the reinforcing material according to the present invention, for example, sheet-formed base materials (base material sheets) of metal foils such as stainless steel or copper, fiber-reinforced plastics, liquid crystalline polymers, engineering plastics such as polyimide or polyethersulfone, plastics such as polypropylene or polyethylene can be cited. Fibers such as glass fiber, metal fibers, and plastic fibers can also be used.

On the other hand, as the adhesive used for the reinforcing materials according to the present invention, for example, adhesives consisting of thermoplastic resins such as polyimides, polyesters, polyacrylates, and polydimethylsiloxanes, or thermosetting resins (to be called thermosetting adhesives hereafter) such as epoxy resins, phenol resins, urea resins and melamine resins can be cited. Further as the curing agents added to these thermosetting adhesives, for example, dicyandiamide, polyamide, and phthalic anhydride can be cited. These curing agents are preferably added in the ratio of 1 to 200 parts by weight for 100 parts by weight of thermosetting resins. Curing of thermosetting adhesives can be achieved by heat-treatment in the temperature range of 50° C. to 300° C., and more preferably is 100° C. to 250° C., for 10 seconds to 6 hours.

Photo-curable adhesives based upon such polymers as (meth) acrylates and epoxy resins as the main polymer can also be used. As the photo-polymerization initiators added to these photo-curable adhesives, there are benzoin, acetophenone, and benzophenone, that are preferably added to the main polymer in the ratio of 0.001 to 10 parts by weight for 100 parts by weight of the main polymer. Curing of photo-curable adhesives can be achieved by photo-irradiation. As the light source used for photo-irradiation, for example, incandescent lamps, carbon arc lamps, fluorescent lamps, mercury lamps, xenon lamps, and fusion H lamps can be cited. Conditions of photo-irradiation are usually intensity of irradiation of 30 w/cm to 500 w/cm, distance of irradiation of 1 cm to 50 cm, and irradiation time of 0.1 second to 600 seconds.

Appropriate combination of said base material and adhesive enables HRM of the reinforcing material to be 60 or above. Particular examples are explained below as embodiments 1 through 3.

The first embodiment 1 is a reinforcing material comprised of a base material sheet with HRM of 60 or above, and an adhesive provided on one side of said base material sheet. The thickness of the base material sheet maybe, for example, 1 to 00 µm, and more preferably is 5 to 70 µm. The thickness of the adhesive provided on one side of the base material sheet may be, for example, 1 to 50 µm, and more preferably is 5 to 35 µm.

The method of providing adhesives on said base material can be carried out by well-known methods. For example, the adhesive is applied directly on the base material sheet by potting, or uniformly applied using a knife-coater or a T-die extruder. In case the adhesive is solvent type, heat-treatment is carried out in the temperature range of 30° C. to 150° C. for 30 seconds to 2 hours to remove the solvent after application of the adhesive.

Further, as an indirect method, an adhesive can be applied on a process material having release property to form an adhesive sheet by the above-mentioned method, and then the adhesive sheet is attached to the base material sheet. As the method of attaching, for example, the sheet can be attached by pressurizing in a range of 10 Pa to 100 MPa using a press machine or a roll press machine in a temperature range of −40 ° C. to 150° C.

Next, the second embodiment is a reinforcing material comprised of a base material sheet and a curable adhesive provided on one side of said base material sheet, of which HRM after the curable adhesive is cured is 60 or above. The thickness of the base material sheet may be, for example, 1 to 100 µm, and more preferably is 5 to 70 µm. The thickness of the adhesive layer provided on one side of the base material sheet may be, for example, 1 to 200 µm, and more preferably is 5 to 100 µm.

A base material sheet with HRM of 60 or above may not necessarily be used, if HRM of the reinforcing material after the curable adhesive is cured can be made 60 or above. For example, base material sheets with HRM of less than 60 such as polyethylene (HRM 40) can be used. Although thermosetting adhesives or photo-curable adhesives described above can be used as said curable adhesive, thermosetting epoxy adhesives with excellent tensile strength, flexural strength, and impact strength after curing is preferably used. Manufacture of reinforcing materials in said second embodiment can be carried out in the same way as said first embodiment.

Further, in the third embodiment, the reinforcing material is comprised of a base material consisting of fibers impregnated with a curable adhesive, of which the HRM after the curable adhesive is cured is 60 or above. In this case, the reinforcing material can be either fibers formed into sheets and impregnated with curable adhesive, or cut fibers mixed with curable adhesive and formed into sheets. The thickness of the reinforcing material may be 20 to 150 µm, and more preferably is 50 to 100 µm.

The amount of the curable adhesive used for the amount of fibers may be 10 to 500 parts by weight, and preferably is 20 to 200 parts by weight, of curable adhesive for 100 parts by weight of fibers. When the amount of curable adhesive used for 100 parts by weight of fibers is less than 10 parts by weight, required Rockwell strength cannot be obtained, and when it surpasses 500 parts by weight, the reinforcing material becomes brittle and easy to break. Further, although thermosetting adhesives or photo-curable adhesives described above can be used as the curable adhesive, thermosetting epoxy adhesives with excellent tensile strength, flexural strength, and impact strength after curing may be preferably used.

In the combination of the base material and the adhesive in said third embodiment, manufacture of the reinforcing material is carried out by the method of uniformly applying a mixture of fiber and curable adhesive on a process material with release property using a knife coater or a T-die extruder, or by the method of impregnating the fiber formed into sheets in advance with curable adhesive using a roll coater or a knife coater.

Next, the method of manufacture of IC chips according to the present invention is explained with reference to drawings.

Figure 1B:
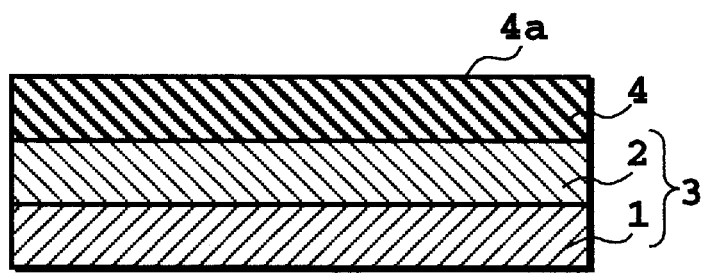
Figure 1C:
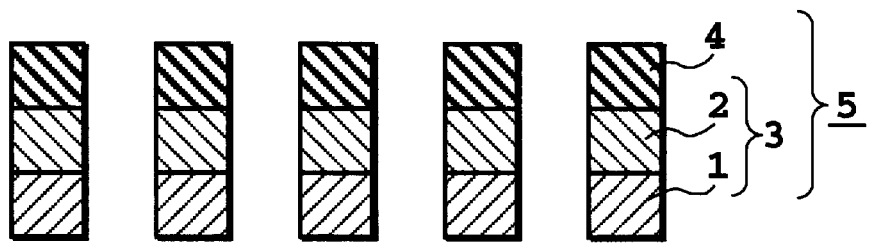

FIGS. 1A through 1C are schematic cross-sectional views illustrating in order the steps of the first method of manufacture of IC chips according to the present invention. Thus, the first method of manufacture includes:

the first step of preparing a reinforcing material 3 comprised of a base material sheet 1 and adhesive 2, and a silicon wafer 4 having the circuit side 4a on which circuits are formed (FIG. 1A);

the second step of attaching the adhesive 2 side of the reinforcing material 3 to the bottom side 4b of the silicon wafer 4 (FIG. 1B); and the third step of dicing both the reinforcing material 3 and the silicon wafer 4 to divide them into IC chips (FIG. 1C).

Therefore, each of the IC chips 5 obtained by this method of manufacture is characterized by being provided with a reinforcing material 3. In order to obtain sufficient reinforcing effect in the manufacture of IC chips, use of reinforcing material with HRM of 60 or above is essential.

Figure 2A:
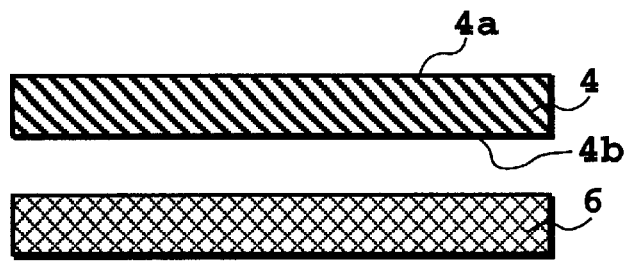
FIGS. 2A through 2D are schematic cross-sectional views illustrating in the order the steps of the second method of manufacture of IC chips according to the present invention.
Figure 2B:
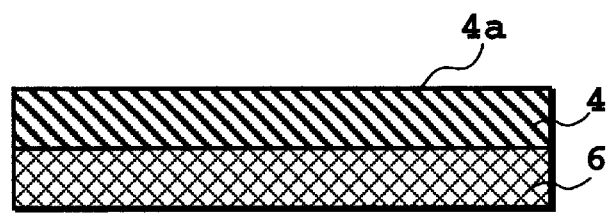
Figure 2C:
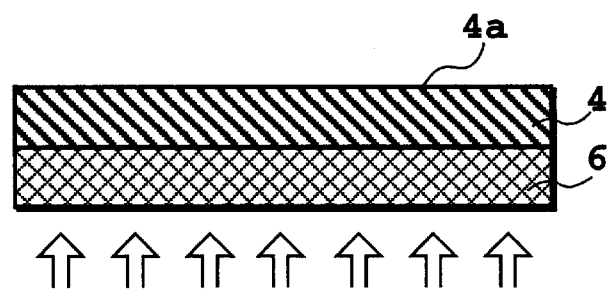
Figure 2D:
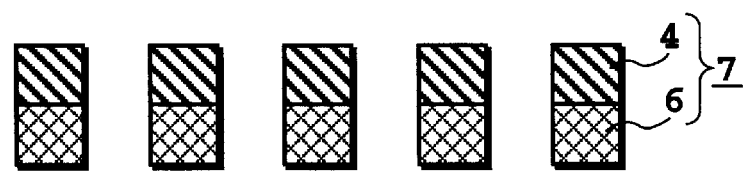

FIGS. 2A through 2D are schematic cross-sectional views illustrating in order the steps of the second method of manufacture of IC chips according to the present invention. Thus, the second method of manufacture includes:

the first step of preparing a reinforcing material 6 comprised of fibers and curable resin, and a silicon wafer 4 having the circuit side 4a on which circuits are formed (FIG. 2A);

the second step of attaching the reinforcing material 6 to the bottom side 4b of the silicon wafer 4 (FIG. 2B);

the third step of curing the curable adhesive (FIG. 2C); and the fourth step of dicing both the reinforcing material 6 and the silicon wafer 4 to divide them into IC chips (FIG. 2D).

Therefore, each of the IC chips 7 obtained by this method of manufacture is characterized by being provided with a reinforcing material 6. In order to obtain sufficient reinforcing effect in the manufacture of IC chips, use of reinforcing material with HRM of 60 or above after the curable adhesive is cured is essential.

The reinforcing material 6 is prepared either by impregnating fibers formed into sheets with curable adhesives or by extruding a mixture of fibers and curable adhesives in a form of a sheet. Curing of curable adhesives can be achieved by heating when thermosetting adhesive is used and by photo-irradiation when photo-curable adhesive is used respectively. The arrows in FIG. 2C schematically show heat-treatment or photo-irradiation for reinforcing material impregnated with curable adhesives.

Even in the case of reinforcing material comprised of a base sheet and adhesive provided on one side of said base material sheet wherein the adhesive is a curable adhesive, IC chips can be manufactured by providing a step of curing of the adhesive as in the second method of manufacture described above.

According to the method of manufacture of IC chips depending upon the present invention, since both the silicon wafer and the reinforcing material attached to the bottom side of said silicon wafer are diced together, not only prevention of damage of silicon wafers during dicing can be achieved but also IC chips provided with reinforcing materials can be obtained in an easier way than before. Moreover, the IC chips obtained are provided with the same size of reinforcing materials. Therefore, they can be handled in the same way as the conventional IC chips in the steps after dicing, and can be effectively prevented from damage.

EXAMPLES

Although the reinforcing materials and the method of manufacture of IC chips according to the present invention is explained in more detail in reference to examples, it is needless to say that the present invention is not limited by those examples but can be widely modified within the range of its scope. The examples are described using the reference numbers in the drawings. Therefore, the present invention may be easily understood by reference to FIGS. 1A through 1C and 2A through 2D.

The Rockwell hardness test and chip break test of the IC chips provided with reinforcing materials in the following examples were carried out as follows.

<Rockwell Hardness (HRM) Test>

The Rockwell hardness tests were carried out according to the scale M of JIS K7202 "Rockwell hardness test of plastics." The reinforcing material comprised of the base material sheet and the adhesive provided on one side of said base material sheet is loaded from the base material sheet side. The reinforcing material (single layer structure in this case) comprised of base material comprising fibers and a curable adhesive is loaded from an optional side. Further, when curable adhesive was used, determination was carried out after curing of the adhesive. The Rockwell hardness values determined by the above-mentioned method indicate higher hardness as the values are higher, with the upper limit of 200. Determined values of Rockwell hardness higher than 200 are indicated as 200 or more.

<Chip Break Test>

In chip break tests, test pieces of silicon wafer diced in a size of 5 mm by 5 mm were placed on a 2 mm. thick of nitrile rubber sheet, 1.0 mm diameter copper balls were placed on them and damage of the chips when loads of 3N were applied was examined.

Example 1

Example 1 illustrates a method of manufacture of an IC chip 5 by forming a reinforcing material 3 comprised of a base material sheet 1 and adhesive 2 provided on one side of said base material sheet 1, and then attaching it to a silicon wafer before dicing.

A 20 μm thick sheet of thermoplastic polyimide resin adhesive 2 was applied to one side of a 30 μm stainless steel foil as the base material sheet 1 to form reinforcing material 3, that was die-cut to obtain a 5 inch diameter disc. A 50 μm thick 5 inch diameter silicon wafer 4 was separately prepared.

Next the adhesive 2 side of the cut reinforcing material 3 was attached to the bottom side 4b of the silicon wafer 4. Then the silicon wafer 4 and the reinforcing material 3 were completely attached by heating under a pressure of 5 kPa at 230° C. for 30 minute.

Next, the silicon wafer 4 provided with reinforcing material 3 was diced to form 5 mm by 5 mm square IC chips 5 using a wafer-dicing machine A-WD4000B from Tokyo Seimitsu Co. Ltd. The IC chips obtained were inspected with a reflection microscope to reveal no cracks of 5 μm or above.

Next, Rockwell hardness test of the reinforcing material and chip break test of IC chips 5 obtained were carried out. The results are shown in Table 1.

Example 2

Example 2 was carried out in the same way as Example 1 except that the reinforcing material 3 was prepared by applying polydimethylsiloxane-based pressure sensitive adhesive as adhesive 2 on one side of a 50 μm thick of polyimide film as the base material sheet 1 so that the thickness after drying was 20 μm. However, adhesion of the reinforcing material 3 and silicon wafer 4 was carried out by pressurizing at 5 kPa using a press roller and then heating at 80° C. for 3 minutes.

Next, IC chips were obtained from the silicon wafer 4 provided with the reinforcing material 3 in the same way as Example 1, and observation showed no crack of 5 μm or more on the IC chips.

Then Rockwell hardness test of the reinforcing material 3 and chip break test of IC chips 5 obtained were carried out. The results are shown in Table 1.

Example 3

Example 3 was carried out in the same way as Example 1 except that the reinforcing material 3 was prepared by attaching an 82 μm thick sheet-formed adhesive 2 made of thermosetting epoxy resin to one side of 20 μm thick polyethylene film as base material sheet 1. Here, the thermosetting epoxy resin sheet as the adhesive 2 is prepared by adding 10 parts by weight of dicyandiamide as a curing agent to 100 parts by weight of bisphenol A-based epoxy resin, mixing and molding by extrusion. Adhesion of the reinforcing material 3 and the silicon wafer 4 was carried out at 120° C. for 60 minutes. During this, curing of the adhesive 2 occurred by heating.

Next, IC chips 5 were obtained from the silicon wafer 4 provided with the reinforcing material 3 in the same way as Example 1, and observation showed no crack of 5 μm or more on the IC chips.

Then Rockwell hardness test of the reinforcing material 3 and chip break test of IC chips 5 obtained were carried out. The results are shown in Table 1. The Rockwell hardness test was carried out with the reinforcing material after heat curing of the adhesive at 120° C. for 60 minutes.

Example 4

Example 4 illustrates a method of manufacture of IC chips 7 provided with reinforcing material 6 prepared by mixing fibers with thermosetting adhesive and forming into a sheet.

To 100 parts by weight of bisphenol-A-based epoxy resin, 60 parts by weight of polyamide was added as a curing agent to form a thermosetting adhesive, mixed with 100 parts by weight of glass fiber with fiber diameter of 10 μm and length of 20 mm to be the base material, and extrusion-molded to prepare 100 μm thick glass fiber sheet to be the reinforcing material 6 impregnated with thermosetting epoxy resin. Then the reinforcing material 6 obtained was die-cut into a 5 inch diameter disc. Also a 50 μm thick 5 inch diameter silicon wafer 4 was prepared.

Next, the bottom side 4b of silicone wafer 4 and the die-cutting reinforcing material 6 were attached. And then, the silicone wafer 4 and the die-cutting reinforcing material 6 were adhered by heating at 200° C. for 30 minutes thereby curing the thermosetting adhesive.

Next, IC chips 7 were obtained from the silicon wafer 4 provided with the reinforcing material 6 in the same way as Example 1, and observation showed no crack of 5 μm or more on the IC chips.

Then Rockwell hardness test of the reinforcing material 6 and chip break test of IC chips 7 obtained was carried out. Both the results are shown in Table 1. The Rockwell hardness test was carried out with the reinforcing material after curing of the adhesive.

Comparative Example 1

Comparative example 1 was carried out in the same way as Example 1 except that the reinforcing material 3 was prepared using 80 μm thick polyethylene film as the base material sheet, and applying acrylic ester-base pressure sensitive adhesive as the adhesive 2 on one side of said polyethylene film to be of a thickness of 20 μm after drying. Adhesion of reinforcing material 3 and silicon wafer 4 was carried out by pressurizing at 5 kPa using a press roller and then heating at 80° C. for 3 minutes.

Next, IC chips 5 were obtained from the silicon wafer 4 provided with the reinforcing material 3 in the same way as Example 1, and observation showed cracks of 5 μm or more at the ends of five IC chips out of 100 IC chips.

Then, Rockwell hardness test of the reinforcing material 3 and chip break test of IC chips 5 obtained was carried out. The results are shown in Table 1.

Comparative Example 2

A silicon wafer having 50 μm of thick and 5 inch of diameter 4 was prepared and was diced to form 5 mm by 5 mm square IC chips 5 using a wafer-dicing machine A-WD4000B from Tokyo Seimitsu Co. Ltd. The IC chips obtained were inspected with a reflection microscope to reveal cracks of 5 μm or more at the ends of 32 IC chips out of 100 IC chips. Chip break test of IC chips 5 obtained was carried out. The results are shown in Table 1.

TABLE 1

| | HRM of reinforcing material | Chip break test result* |
|---|---|---|
| Example 1 | 200 or more | 0 |
| Example 2 | 92 | 0 |
| Example 3 | 75 | 0 |
| Example 4 | 95 | 0 |
| Comparative example 1 | 40 | 65 |
| Comparative example 2 | — | 99 |

*Each number shows the number of broken chips out of 100 chips.

According to the present invention as explained above, providing the bottom side of silicon wafer with reinforcing material prior to dicing of the silicon wafer enables prevention of damage of the silicon wafer during dicing and greatly reduce chip break occurrence, and provides reinforcing material that enables improvement of productivity. It also enables a method of manufacture of IC chips that do not break during picking-up after dicing, during mounting on substrate circuits, and during wire bonding.

The present invention has been described in detail with respect to preferred embodiments, and it will now be apparent from the foregoing to those skilled in the art that changes and modifications may be made without departing from the invention in its broader aspects. And, it is the intention in the appended claims that defines true scope of the invention.

What is claimed is:

1. A reinforcing material for a silicon wafer, said reinforcing material being attached, prior to dicing of said silicon wafer on which circuits are formed, to one side of said silicon wafer on which circuits are not formed, comprising:

a base material said base material being selected from the group consisting of fiber-reinforced plastics, liquid crystalline polymers, engineering plastics, and plastics; and adhesive attached to the one side of said silicon wafer on which circuits are not formed, said adhesive being selected from the group consisting of thermoplastic resins, polyimides, polyesters, polyacrylates, polydimethyl-siloxanes, thermosetting resins, phenol resins, urea resins, melamine resins, photo-curable resins, (meth)acrylates and epoxy resins as a main polymer, wherein said reinforcing material has M-scale Rockwell hardness of 60 or above.

2. The reinforcing material according to claim 1, wherein said adhesive is provided on one side of said base material.

3. The reinforcing material according to claim 1, wherein said base material has M-scale Rockwell hardness of 60 or above.

4. The reinforcing material according to claim 1, wherein said adhesive is curable adhesive and M-scale Rockwell hardness of said reinforcing material after curing of said adhesive is 60 or above.

5. The reinforcing material according to claim 1, wherein said base material is sheet-formed.

6. A reinforcing material for a silicon wafer, said reinforcing material being attached, prior to dicing of said silicon wafer on which circuits are formed, to one side of said silicon wafer on which circuits are not formed, comprising:

a base material; said base material being selected from the group consisting of glass fibers, metal fibers, and plastic fibers;

adhesive selected from the group consisting of thermoplastic resins, polyimides, polyesters, polyacrylates, polydimethyl-siloxanes, thermosetting resins, phenol resins, urea resins, melamine resins, photocurable resins, (meth)acrylates, and epoxy resins as a main polymer, said base material being impregnated with said adhesive, wherein said reinforcing material has M-scale Rockwell hardness of 60 or above.

7. The reinforcing material according to claim 6, wherein said base material has M-scale Rockwell hardness of 60 or above.

8. The reinforcing material according to claim 6, wherein said adhesive and M-scale Rockwell hardness of said reinforcing material after curing of said curable adhesive is 60 or above.

* * * * *